(12) United States Patent
Isokawa

(10) Patent No.: US 7,202,507 B2
(45) Date of Patent: Apr. 10, 2007

(54) OPTICAL SEMICONDUCTOR DEVICE

(75) Inventor: Shinji Isokawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/875,599

(22) Filed: Jun. 23, 2004

(65) Prior Publication Data
US 2005/0040405 A1 Feb. 24, 2005

(30) Foreign Application Priority Data
Jun. 24, 2003 (JP) ............................ 2003-179862

(51) Int. Cl.
*H01L 33/00* (2006.01)
(52) U.S. Cl. ............................ 257/95; 257/81; 257/91; 257/98; 257/99; 257/100
(58) Field of Classification Search .................... None
See application file for complete search history.

(56) References Cited

U.S. PATENT DOCUMENTS 6,355,946 B1 3/2002 Ishinaga 6,614,172 B2 * 9/2003 Chiu et al. .................. 313/501
6,657,236 B1 * 12/2003 Thibeault et al. ............. 257/98
2003/0209714 A1 * 11/2003 Taskar et al. ................ 257/79

FOREIGN PATENT DOCUMENTS

JP 2000-183407 6/2000

* cited by examiner

*Primary Examiner*—Wai-Sing Louie
(74) *Attorney, Agent, or Firm*—Hamre, Schumann, Mueller & Larson, P.C.

(57) ABSTRACT

An optical semiconductor device includes an optical semiconductor chip and a light permeable member covering the optical semiconductor chip. The light permeable member has a light emitting surface for emitting light coming out from the optical semiconductor chip to the outside. The light emitting surface includes a plurality of standing surfaces standing in a second direction which intersects a first direction in which the light emitting surface spreads.

9 Claims, 6 Drawing Sheets

OPTICAL SEMICONDUCTOR DEVICE

BACKGROUND OF THE INVENTION

1. Field of the invention

The present invention generally relates to an optical semiconductor device provided by utilizing an optical semiconductor chip such as an LED chip.

2. Description of the Related Art

A light emitting diode (LED) has advantages such as small power consumption, small size and long lifetime. Therefore, an optical semiconductor device incorporating an LED chip can be advantageously used as a light source for the display of a cellular phone or a notebook computer, for example. Such an optical semiconductor device is so designed as to enhance the brightness. For example, JP-A-2000-183407 discloses the provision of an optical reflector surrounding the LED chip.

FIG. 8 shows an optical semiconductor device as a related art of the present invention. The illustrated semiconductor device B includes a substrate 101, an LED chip 102 mounted on the substrate, and a light permeable member 103 covering the LED chip. The light permeable member 103 has a flat upper surface (light emitting surface) 131 for emitting light. The light permeable member 103 is surrounded by a reflector 104. The reflector 104 has an inclined surface (light reflecting surface) 141 adjoining the light permeable member 103.

As shown in FIG. 8, the light $L_{11}$ traveling straight up from the LED chip 102 is emitted to the outside through the light emitting surface 131. The light $L_{14}$ traveling horizontally from the LED chip 102 is reflected upward by the light reflecting surface 141 of the reflector 104. Thus, the amount of light emitted from the light emitting surface 131 of the light permeable member can be increased by reflecting the light traveling horizontally from the LED chip 102 upward.

However, the semiconductor device B still has a room for improvement for enhancing the brightness, because the semiconductor device B has the following problems.

The light coming out from the LED chip 102 impinges on the light emitting surface 131 at various incidence angles. The incidence angles can be divided into those which are larger than the total reflection critical angle and those which are smaller than the total reflection critical angle. For example, the incidence angle $\alpha 12$ of the light $L_{12}$ shown in FIG. 8 is smaller than the total reflection critical angle $\alpha c$. The incidence angle $\alpha 13$ of the light $L_{13}$ shown in FIG. 8 is larger than the total reflection critical angle $\alpha c$. Therefore, the light $L_{13}$ is totally reflected by the light emitting surface 131 and cannot be emitted to the outside of the light permeable member 103.

As noted above, in the optical semiconductor device B, some of the light coming out from the LED chip 102 may not be emitted to the outside from the light emitting surface 131. Such light is attenuated while undergoing repetitive reflection within the optical semiconductor device B and cannot be utilized as light for illumination.

SUMMARY OF THE INVENTION

The present invention has been conceived under the circumstances described above. It is therefore an object of the present invention to provide a compact optical semiconductor device which is capable of enhancing the brightness while suppressing an increase in the power consumption.

According to a first aspect of the present invention, there is provided an optical semiconductor device comprising an optical semiconductor chip capable of emitting light, and a light permeable member covering the optical semiconductor chip and having a light emitting surface for emitting light coming out from the optical semiconductor chip to the outside. The light emitting surface is irregular and includes a plurality of standing surfaces standing in a second direction which intersects a first direction in which the light emitting surface spreads.

Preferably, the light emitting surface includes a plurality of non-standing surfaces having a normal extending in the second direction.

Preferably, the light permeable member is formed with a plurality of projections standing in the second direction. The projections include a plurality of side surfaces providing the standing surfaces and top surfaces providing part of the non-standing surfaces.

Preferably, other part of the non-standing surfaces is provided by a region positioned between the projections.

Preferably, the plurality of projections are arranged in a matrix at the light emitting surface, and each of the projections is in the form of a rectangular parallelepiped.

Preferably, each of the projections has a height and a width which are determined to satisfy an inequality $H < W \times \tan \alpha c$, wherein H is the height of the projection, W is the height of the projection, and $\alpha c$ is a total reflection critical angle of the light permeable member.

Preferably, the optical semiconductor device further comprises a reflector surrounding the light permeable member, and an insulating substrate for mounting the optical semiconductor chip, the light permeable member and the reflector. The reflector includes a reflecting surface for reflecting light coming out from the optical semiconductor chip toward the light emitting surface, and the substrate is formed with a conductor portion electrically connected to the optical semiconductor chip.

Other features and advantages of the present invention will become clearer from the description given below with reference to the accompanying drawings.

DETAILED DESCRIPTION OF THE PREFERRED EMBODIMENTS

Preferred embodiments of the present invention will be described below with reference to the accompanying drawings.

Figure 1:
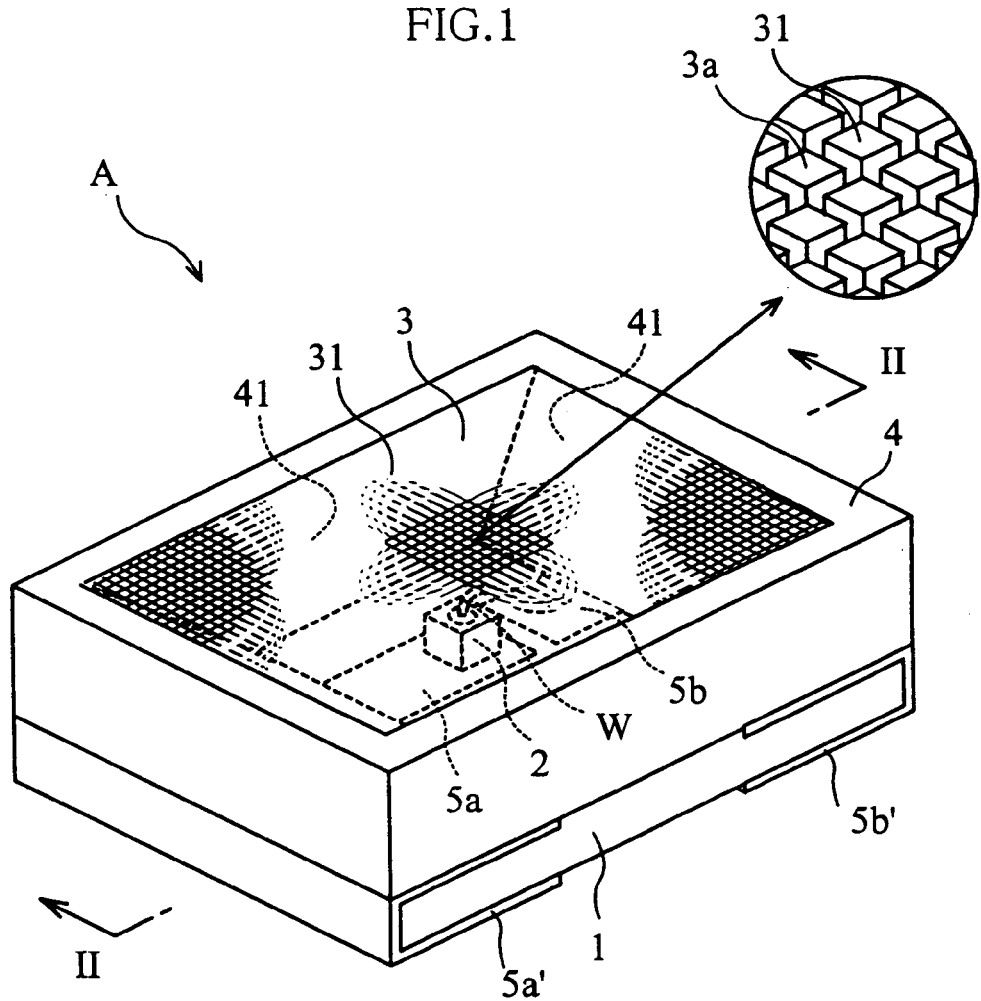
FIG. 1 is a perspective view showing an optical semiconductor device according to the present invention.
Figure 2:
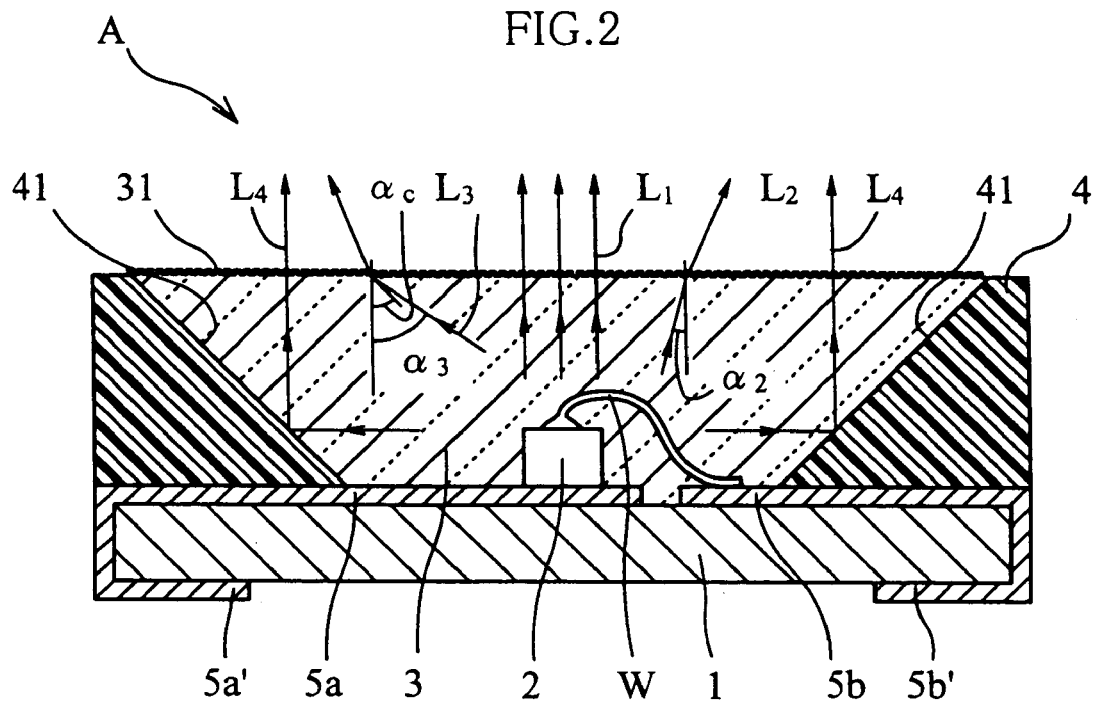
FIG. 2 is a sectional view taken along lines II—II in FIG. 1.
Figure 3:
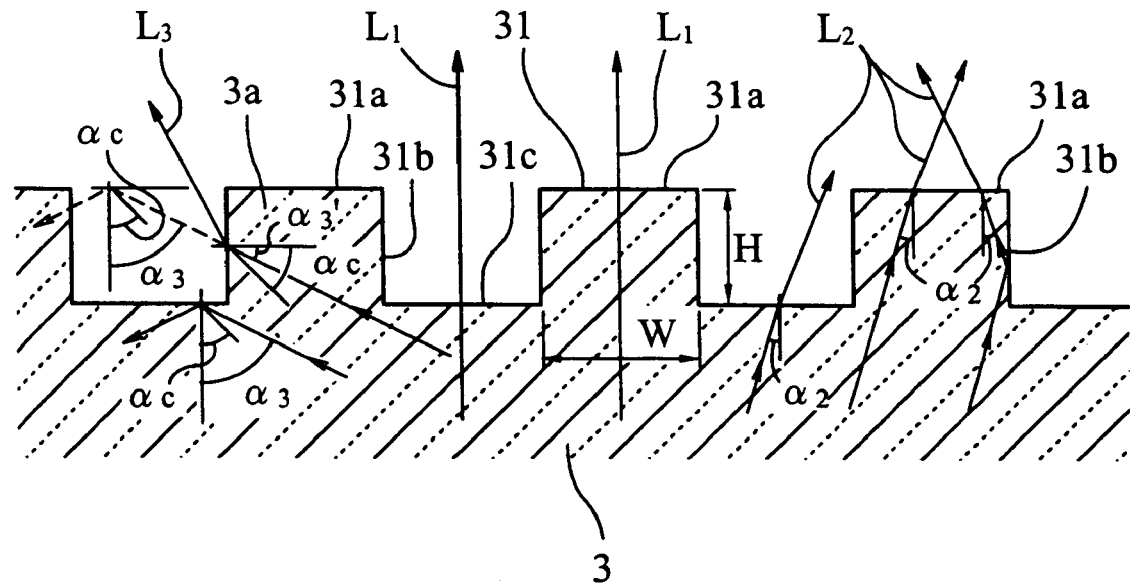
FIG. 3 is an enlarged sectional view showing the configuration of the upper surface of a light permeable member used in the optical semiconductor device according to the present invention.

FIG. 1–3 illustrate an optical semiconductor device according to the present invention. The illustrated optical semiconductor device A includes a substrate 1, an LED chip 2, a light permeable member 3 and a reflector 4.

The substrate 1 comprises a flat insulating plate having an upper surface and a lower surface which are rectangular and extend in parallel with each other. The substrate 1 is made of a glass-fiber-reinforced epoxy resin, for example. The LED chip 2, the light permeable member 3 and the reflector 4 are mounted on the upper surface of the substrate 1. As shown in FIG. 2, on the substrate 1 are formed a first conductor 5a and a second conductor 5b each of which extends from the upper surface up to the lower surface of the substrate 1. The first conductor 5a includes a surface-mounting terminal 5a' located on the lower surface of the substrate 1. Similarly, the second conductor 5b includes a terminal 5b'.

The upper surface and the lower surface of the LED chip 2 are formed with an upper electrode and a lower electrode (both not shown), respectively. The LED chip 2 is bonded to the first conductor 5a. By this bonding, the lower electrode of the chip 2 is electrically connected to the first conductor 5a. The upper electrode of the chip 2 is electrically connected to the second conductor 5b via a wire W.

The light permeable member 3 is made of a transparent epoxy resin, for example. The light permeable member 3 covers the LED chip 2 and is surrounded by the reflector 4. As will be understood from FIGS. 1 and 2, the light permeable member 3 has an upper surface, i.e. light emitting surface 31 with minute irregularities. As shown in FIG. 2, the light emitting surface 31 spreads horizontally.

In the illustrated example, the light emitting surface 31 is formed with a plurality of projections 3a arranged in a matrix. Each of the projections 3a is in the form of a rectangular parallelepiped standing vertically. Each of the projections 3a has a single horizontal top surface (non-standing surface) 31a and four side surfaces (standing surfaces) 31b (See FIG. 3). The light emitting surface 31 includes flat portions (indicated by reference sign 31c in FIG. 3) at which the projections 3a are not formed and which are lower than the top surfaces 31a of the projections 31 and parallel with the top surfaces (hereinafter, the flat portions 31c are referred to as "bottom surface 31c").

Each of the top surfaces 31a (non-standing surface), the side surfaces 31b (standing surface) and the bottom surface 31c (non-standing surface) is made a mirror surface with reduced surface roughness for preventing scattering of the light impinging on these surfaces. The non-standing surfaces 31a and 31c have a normal which extends vertically.

Each of the projections 3a has a height H and a width W (See FIG. 3) which are so determined as to satisfy the inequality H<W×tan $\alpha c$, wherein $\alpha c$ is the total reflection critical angle of the light permeable member 3. Particularly in the example shown in FIG. 3, the height H and the width W are so determined as to satisfy the equation H=W×tan $\alpha c$. When the light permeable member 3 is made of an epoxy resin, its refractive index relative to air is about 1.5, and the total reflection critical angle is about 42°. According to the above equation H=W×tan $\alpha c$, if the width W of the projection 3a is e.g. 0.3 mm, the height H is about 0.27 mm.

The reflector 4 is in the form of a rectangular frame having an accommodation space for accommodating the light permeable member 3 therein. The reflector 4 has a plurality of inner wall surfaces (light reflecting surfaces) 41. The reflector 4 may be made of white-based resin prepared by adding titanium oxide to polycarbonate, for example. Therefore, each of the light reflecting surfaces 41 is a white surface having a high reflectivity. Each of the light reflecting surfaces 41 is flat and inclined at an appropriate angle to the vertical for reflecting the light traveling horizontally from the LED chip 2 upward. The reflector 4 may be made of liquid crystal polymer or polyamide-based resin, instead of the above-noted material.

Next, the operation and advantages of the optical semiconductor device A will be described.

When a driving voltage is applied to the LED chip 2, light is emitted from the LED chip 2 in various directions. In FIG. 2, the light $L_1$ travels vertically toward the light emitting surface 31, whereas the light $L_2$ travels in a direction inclined at a relatively small angle $\alpha$ to the vertical. As shown in FIG. 3, when the light $L_1$ and $L_2$ impinges on the top surface 31a or the bottom surface 31c, the incidence angle is smaller than the total reflection critical angle $\alpha c$. Therefore, the light $L_1$ and $L_2$ is emitted to the outside of the light permeable member 3 through these surfaces. On the other hand, when the light $L_1$ and $L_2$ impinges on the side surface 31b of the projection, the incidence angle is larger than the total reflection critical angle $\alpha c$. Therefore, the light $L_1$ and $L_2$ is totally reflected by the side surface 31b. However, the light $L_1$ and $L_2$ thereafter impinges on the top surface 31a above the side surface 31b at an angle which is smaller than the total reflection critical angle $\alpha c$ and travels upward from the light permeable member 3 through the top surface 31a.

The light $L_3$ travels in a direction inclined at an angle $\alpha 3$, which is larger than the total reflection critical angle $\alpha c$, to the vertical. As shown in FIG. 3, when the light $L_3$ impinges on the bottom surface 31c, the incidence angle $\alpha 3$ is larger than the total reflection critical angle $\alpha c$. Therefore, the light $L_3$ is totally reflected toward the inside of the light permeable member 3. This is the same phenomenon as that of the light $L_{13}$ shown in FIG. 8.

However, when the light $L_3$ impinges on the side surface 31b of the projection, the incidence angle $\alpha 3'$ is (90°−$\alpha 3$), which is smaller than the total reflection critical angle $\alpha c$ in most cases. Therefore, the light $L_3$ is emitted to the outside of the light permeable member 3 through the side surface 31b. (At this time, the light $L_3$ is refracted upward.) In this point, the optical semiconductor device of the present invention differs from the optical semiconductor device shown in FIG. 8. Specifically, in the device shown in FIG. 8, the light $L_{13}$ is totally reflected by the light emitting surface 131 regardless of which point of the light emitting surface the light impinges on. However, in the optical semiconductor device A of the present invention, the light $L_3$ is not always reflected totally by the light emitting surface 31 and can travel to the outside of the light permeable member 3 when the light impinges on the side surface 31b of the projection. It is to be noted that, in the above embodiment, the light $L_3$ does not reach the top surface 31a of the projection because of the relationship between the height H and the width W.

Figure 8:
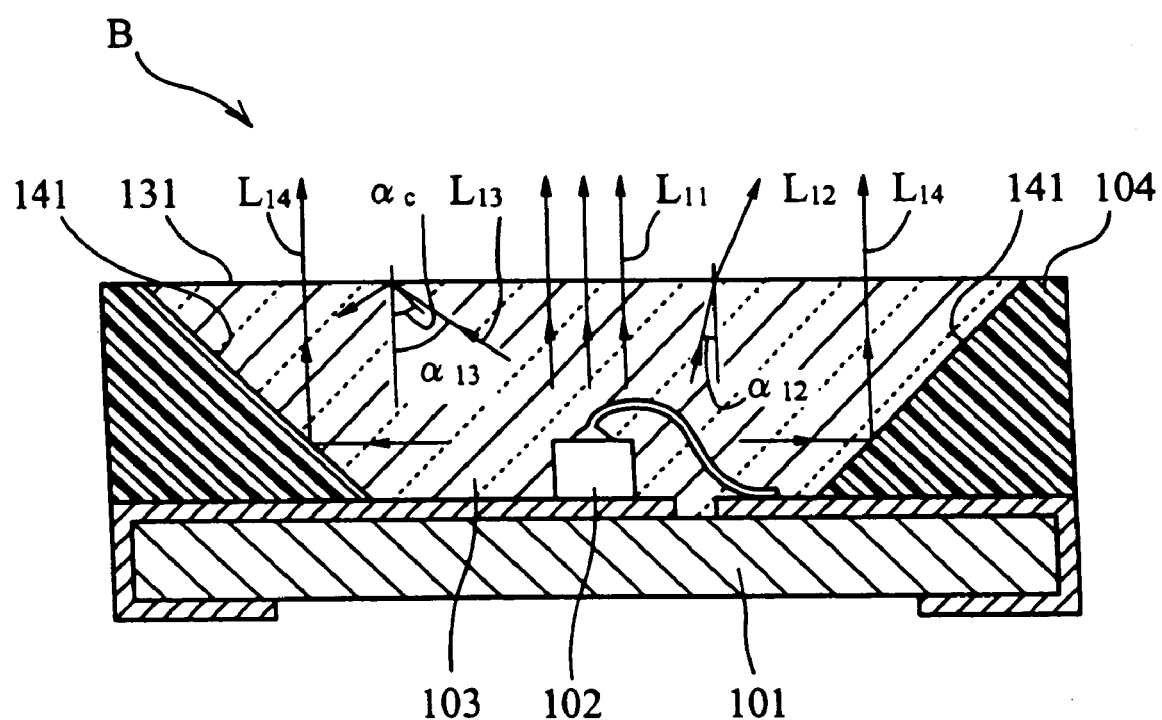
FIG. 8 is a sectional view showing an optical semiconductor device as a related art of the present invention.

As noted above, according to the present invention, a larger amount of light can be emitted through the light emitting surface of the light permeable member than when the structure shown in FIG. 8 is employed. Thus, the brightness can be enhanced by effectively utilizing the light emitted from the LED chip 2.

The technical advantages obtained by setting the height H and the width W of the projection 3a to satisfy the inequality H<W×tan αc are as follows.

Figure 4:
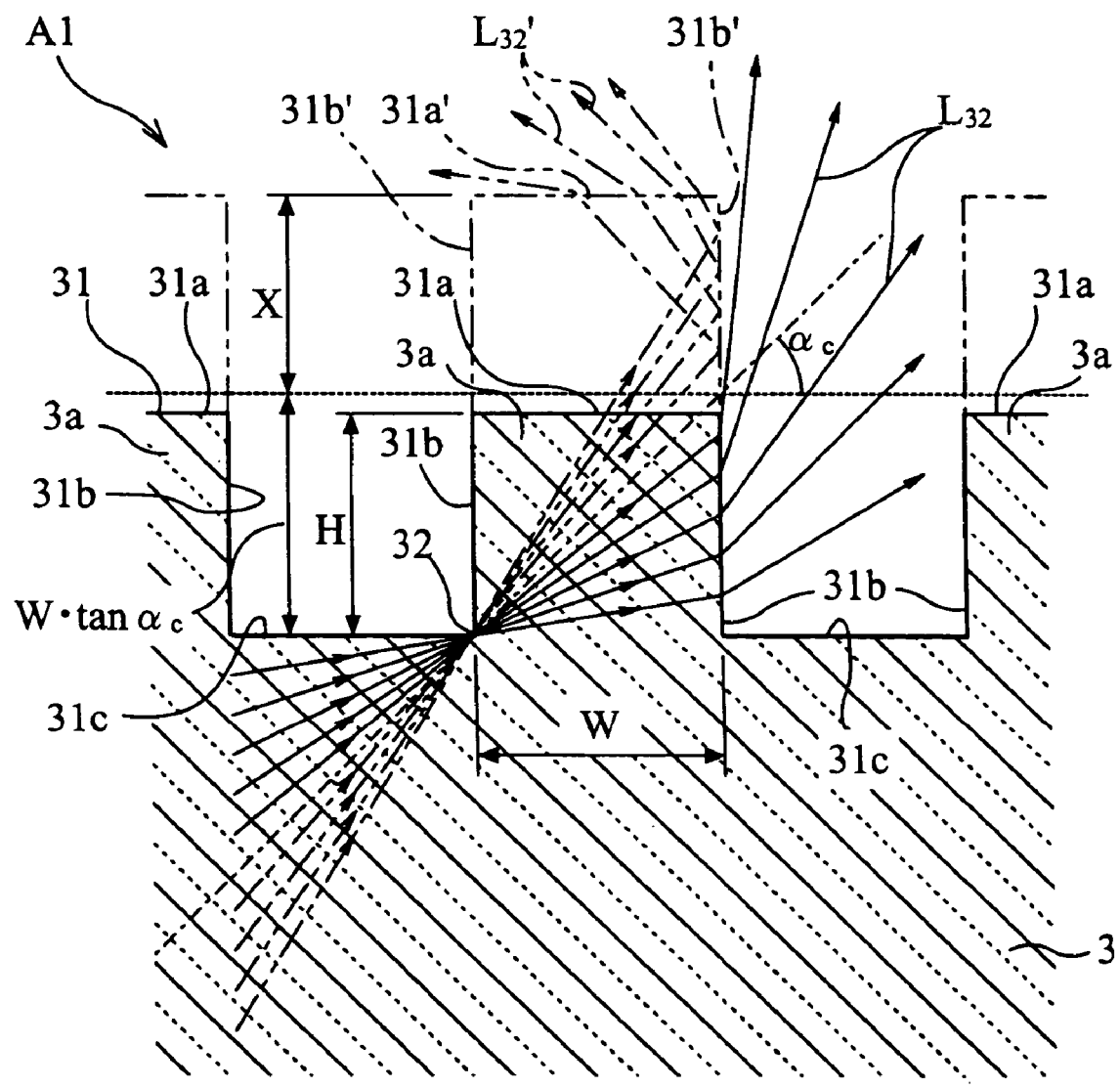
FIG. 4 is a sectional view showing the relationship between the configuration of a projection of the light permeable member and light which can be emitted from the light permeable member.

As shown in FIG. 4, such light as the light $L_{32}$ which impinges, from the inside of the light permeable member 3, on the side surface 31b at an incidence angle which is smaller than the total reflection critical angle αc can be emitted to the outside, whereby the amount of light emitted can be increased. To enhance the brightness, it is preferable to increase the area of the side surface 31b. However, even when the height H of the projection 3a is increased to provide a side surface 31b' at a region X which does not satisfy H<W×tan αc, the side surface 31b' receives only such light as the light $L_{32}$ which impinges on at an angle larger than the total reflection critical angle αc. Therefore, the side surface 31b' is not suitable for increasing the emitted amount of light, so that an increase of the brightness cannot be expected. Further, the light emitted from a side surface of one projection 3a may be blocked by impinging on a side surface of the adjacent projection to enter the light permeable member 3. In this way, an increase in the height of the projection 3a sometimes hinders an increase in the emitted amount of light.

However, the projection 3a having a configuration which satisfies H<W×tan αc does not include a portion like the side surface 31b' which does not contribute to increasing the emitted amount of light. Therefore, the above-noted disadvantages can be reduced, and the brightness can be efficiently enhanced. Particularly, in the optical semiconductor device A, the height H and the width W of the projection 3a is so determined as to satisfy the relation of H=W×tan αc. Therefore, the area of the side surface 31b which can increase the emitted amount of light becomes maximum, so that the optimum brightness can be obtained.

The light $L_{32}$, $L_{32}$ used in the above description is the light which passes through a corner 32 and whose incidence angle is the smallest among the light which impinges on portions of the side surfaces 31b, 31b'. Whether or not the side surfaces 31b, 31b' can emit light and contribute to increasing the emitted amount of light can be determined just by comparing the minimum incidence angle of the light impinging on the surfaces with the total reflection critical angle αc. Therefore, the inequality H<W×tan αc can be obtained by considering the light $L_{32}$, $L_{32}$, only.

Figure 5:
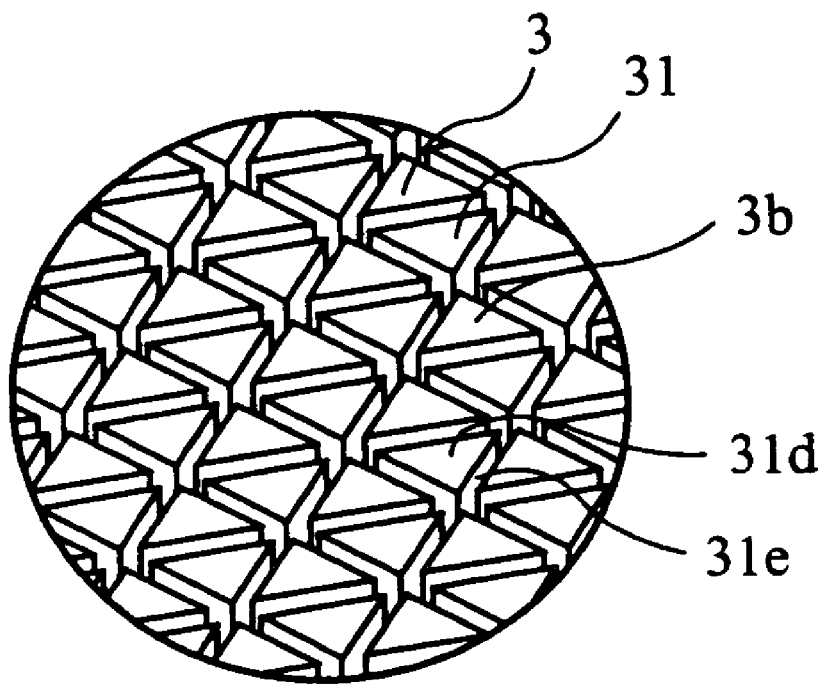
FIG. 5 is a perspective view showing a modified example of light permeable member used in the optical semiconductor device of the present invention.
Figure 6:
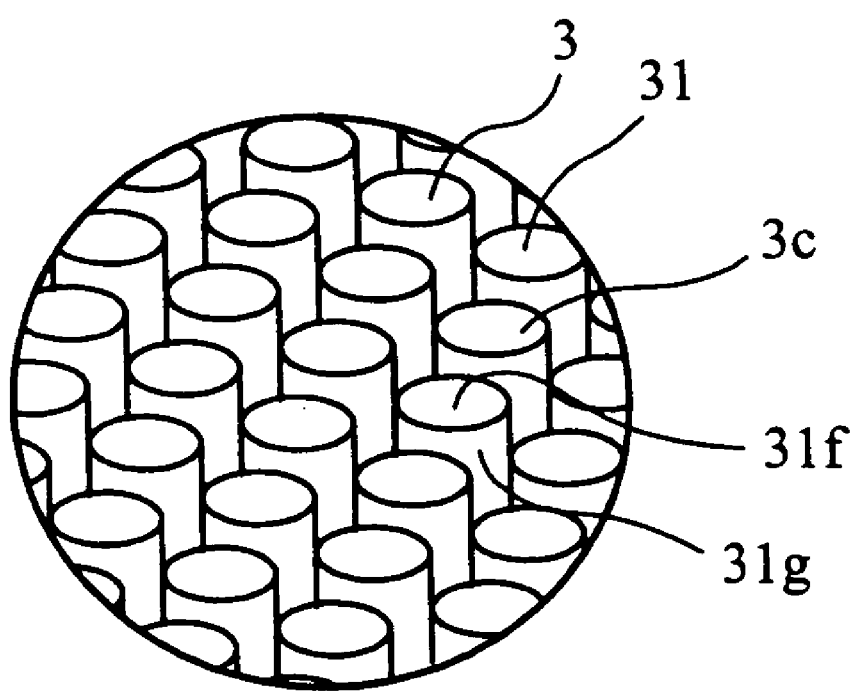
FIG. 6 is a perspective view showing another modified example of light permeable member used in the optical semiconductor device of the present invention.

Although the light emitting surface 31 is provided with a plurality of projections each in the form of a rectangular parallelepiped in the above-described embodiment, the present invention is not limited thereto. For example, the light emitting surface 31 may be formed with projections 3b each in the form of a triangular prism as shown in FIG. 5 or columnar projections 3c as shown in FIG. 6. Also with such structures, the projections 3b, 3c have side surfaces (standing surfaces) 31e, 31g and top surfaces (non-standing surfaces) 31d, 31f, and the light emitting surface 31 becomes an irregular surface. Therefore, similarly to the above-described embodiment, the brightness can be enhanced. In the modified examples shown in FIGS. 5 and 6, the dimension corresponding to the width (e.g. diameter of the column) and the height of the projection are so determined as to satisfy the inequality H<W×tan αc.

Figure 7:
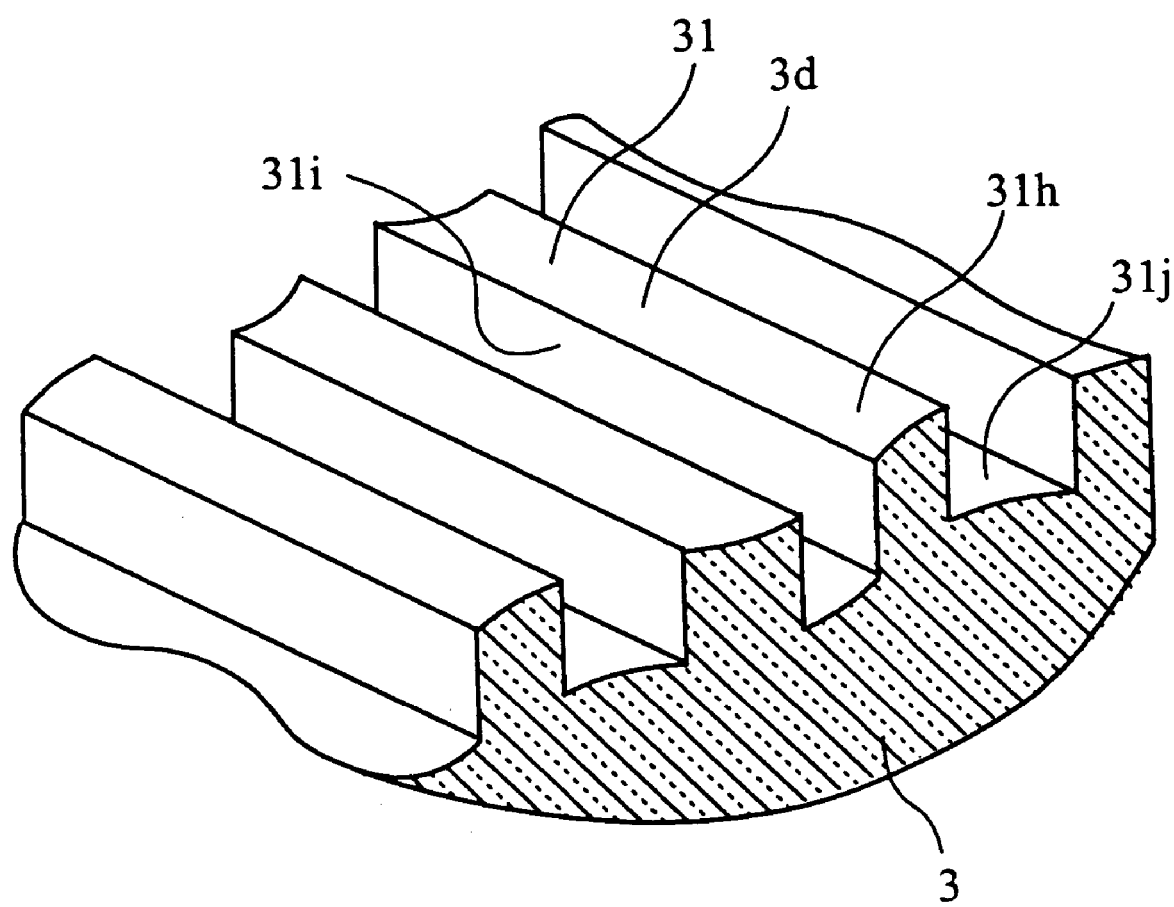
FIG. 7 is a perspective view showing a still another modified example of light permeable member used in the optical semiconductor device of the present invention.

FIG. 7 shows another modified example of configuration of the light emitting surface of the light permeable member 3. In this modified example, the light emitting surface of the light permeable member 3 is provided with a plurality of projections 3d elongated in the same direction. The projections 3d are spaced from each other at a constant pitch. As shown in the figure, each of the projections 3d has a generally rectangular section and includes two side surfaces (standing surfaces) 31i and one top surface 31h. Between adjacent two projections 3d is provided a generally flat bottom surface 31j. With such a structure, part of the light which has reached the side surface 31i can be emitted upward.

Although the side surfaces of the projections extend vertically in the foregoing embodiment and modified examples, the present invention is not limited thereto. Each of the side surfaces may be inclined at a certain angle to the vertical. Further, instead of making the entire light emitting surface irregular, only part of the light emitting surface (e.g. a center portion or peripheral portion) may be made irregular.

The light reflecting surface may be provided by forming e.g. a metal film having a high reflectivity on the inner wall surfaces of the reflector by sputtering or vapor deposition. The light reflecting surface may be curved.

The optical semiconductor chip is not limited to an LED chip, and other elements may be used. The optical semiconductor device according to the present invention may be so designed as to emit e.g. infrared rays instead of visible light.

The present invention being thus described, it is apparent that the same may be varied in many ways. Such variations should not be regarded as a departure from the spirit and scope of the present invention, and all such modifications as would be obvious to those skilled in the art are intended to be included within the scope of the following claims.

The invention claimed is:

1. An optical semiconductor device comprising:
an optical semiconductor chip capable of emitting light, the optical semiconductor chip having an upper surface and a side surface; and
an encapsulating light permeable member covering the optical semiconductor chip in contact with said upper and side surfaces and having a light emitting surface for emitting light coming out from the optical semiconductor chip to outside, the light emitting surface being larger than said upper surface of the semiconductor chip;
wherein the light emitting surface is irregular and includes a plurality of standing surfaces standing in a second direction which intersects a first direction in which the light emitting surface spreads; and
wherein each of the standing surfaces has a height and a width which are determined to satisfy an inequality H<W×tanαc, wherein H is the height of the projection, W is the width of the projection, and αc is a total reflection critical angle of the light permeable member.

2. The optical semiconductor device according to claim 1, wherein the light emitting surface includes a plurality of non-standing flat surfaces extending in the first direction.

3. The optical semiconductor device according to claim 2, wherein the light permeable member is formed with a plurality of projections standing in the second direction, the projections including a plurality of side surfaces providing the standing surfaces and top surfaces providing part of the non-standing surfaces, the standing surfaces extending perpendicularly to the first direction.

4. The optical semiconductor device according to claim 3, wherein other part of the non-standing surfaces is provided by a region positioned between the projections.

5. The optical semiconductor device according to claim 3, wherein the plurality of projections are arranged in a matrix at the light emitting surface, each of the projections being in a form of a rectangular parallelepiped having a horizontal top surface and four vertical side surfaces.

6. The optical semiconductor device according to claim 1, further comprising a reflector surrounding the light permeable member, and an insulating substrate for mounting the optical semiconductor chip, the light permeable member and the reflector, wherein the reflector includes a reflecting surface for reflecting light coming out from the optical semiconductor chip toward the light emitting surface, and wherein the substrate is formed with a conductor portion electrically connected to the optical semiconductor chip.

7. The optical semiconductor device according to claim 1, wherein each of the projections is in a form of a triangular prism having a horizontal top surface and three vertical side surfaces.

8. The optical semiconductor device according to claim 1, wherein each of the projections is columnar with a horizontal top surface and a cylindrical side surface.

9. The optical semiconductor device according to claim 1, wherein each of the projections is elongated in a same horizontal direction.

* * * * *